(12) United States Patent
Riedl et al.

(10) Patent No.: US 7,511,382 B2
(45) Date of Patent: Mar. 31, 2009

(54) SEMICONDUCTOR CHIP ARRANGEMENT AND METHOD

(75) Inventors: Edmund Riedl, Obertraubling (DE); Ralf Otremba, Kaufbeuren (DE); Ivan Galesic, Regensburg (DE)

(73) Assignee: Infineon Technologies AG, Munich (DE)

( * ) Notice: Subject to any disclaimer, the term of this patent is extended or adjusted under 35 U.S.C. 154(b) by 386 days.

(21) Appl. No.: 11/120,838

(22) Filed: May 3, 2005

(65) Prior Publication Data

US 2005/0250245 A1  Nov. 10, 2005

(30) Foreign Application Priority Data

May 3, 2004  (DE) .................. 10 2004 021 633

(51) Int. Cl.
  *H01L 23/52* (2006.01)
  *H01L 23/48* (2006.01)
  *H01L 23/40* (2006.01)
(52) U.S. Cl. ...................... 257/782; 257/783
(58) Field of Classification Search ............... 257/782, 257/783
  See application file for complete search history.

(56) References Cited

U.S. PATENT DOCUMENTS

| | | | |
|---|---|---|---|
| 5,379,942 A | 1/1995 | Kuhnert et al. | |
| 5,981,036 A | 11/1999 | Schulz-Harder et al. | |
| 6,121,689 A * | 9/2000 | Capote et al. | 257/783 |
| 6,172,422 B1 * | 1/2001 | Chigawa et al. | 257/778 |
| 6,392,143 B1 * | 5/2002 | Koshio | 174/528 |
| 6,410,415 B1 * | 6/2002 | Estes et al. | 438/612 |
| 6,472,730 B1 | 10/2002 | Yanagawa et al. | |
| 6,559,523 B2 | 5/2003 | Schmid et al. | |
| 6,633,078 B2 * | 10/2003 | Hamaguchi et al. | 257/686 |
| 6,654,250 B1 * | 11/2003 | Alcoe | 361/719 |
| 6,949,404 B1 * | 9/2005 | Fritz et al. | 438/106 |
| 2002/0158323 A1 * | 10/2002 | Iwasaki | 257/679 |

FOREIGN PATENT DOCUMENTS

| | | |
|---|---|---|
| DE | 277 787 A1 | 4/1990 |
| DE | 39 40 933 C2 | 6/1991 |
| DE | 43 15795 A1 | 11/1994 |
| DE | 101 22 221 A1 | 11/2002 |
| EP | 1 443 546 | 8/2004 |
| JP | 2003174114 | 6/2003 |

OTHER PUBLICATIONS

Search Report mailed ( pgs).

* cited by examiner

*Primary Examiner*—Luan C Thai
(74) *Attorney, Agent, or Firm*—Dicke, Billig & Czaja, PLLC

(57) ABSTRACT

A semiconductor chip arrangement and method is disclosed. In one embodiment, the invention provides a method for providing a semiconductor chip arrangement including providing a semiconductor chip having a first connecting area, and providing a chip carrier having a concave shaped section formed in a second connecting area. A connecting mechanism is provided between the first connecting area and the second connecting area and pressing the semiconductor chip onto the chip carrier such that the connecting mechanism positively locks the first connecting area to the concave shaped section of the second connecting area.

12 Claims, 4 Drawing Sheets

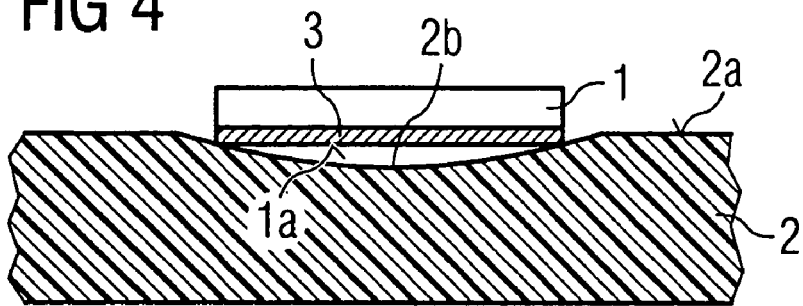
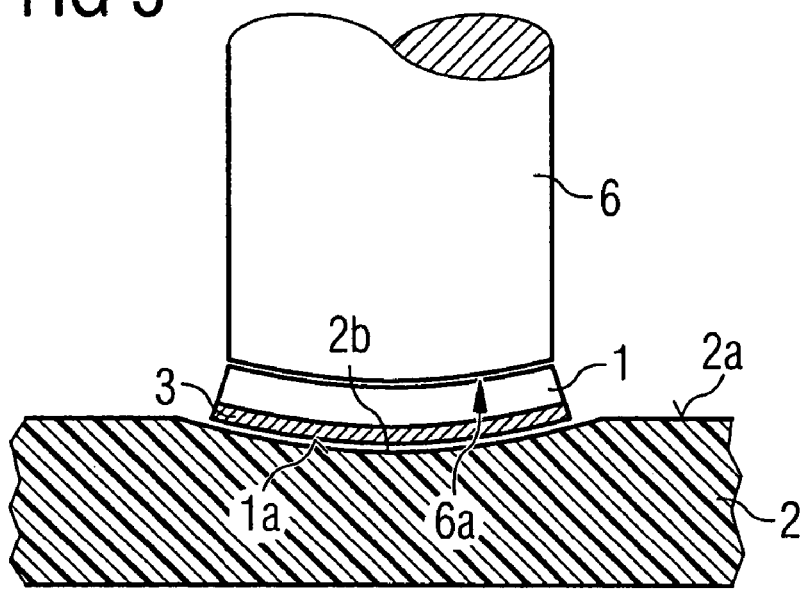
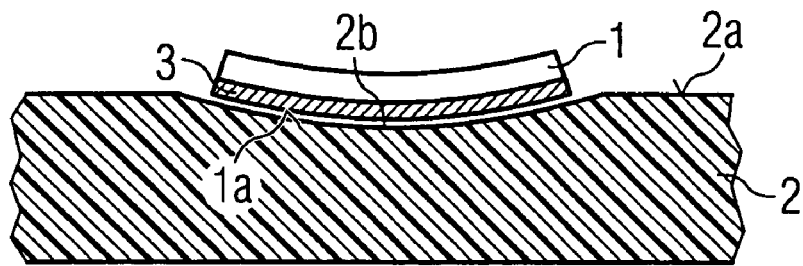

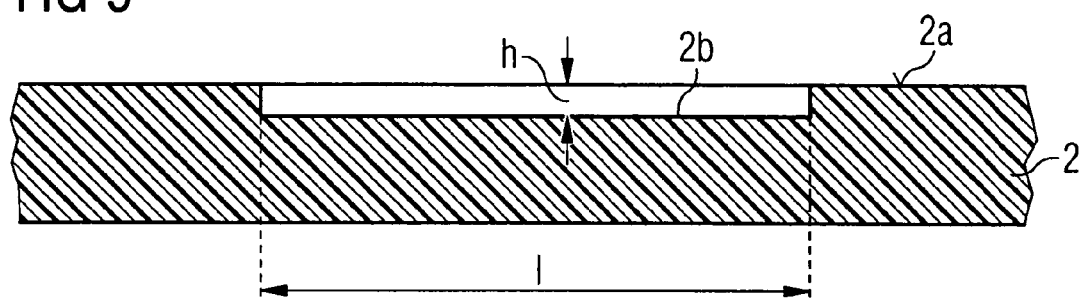
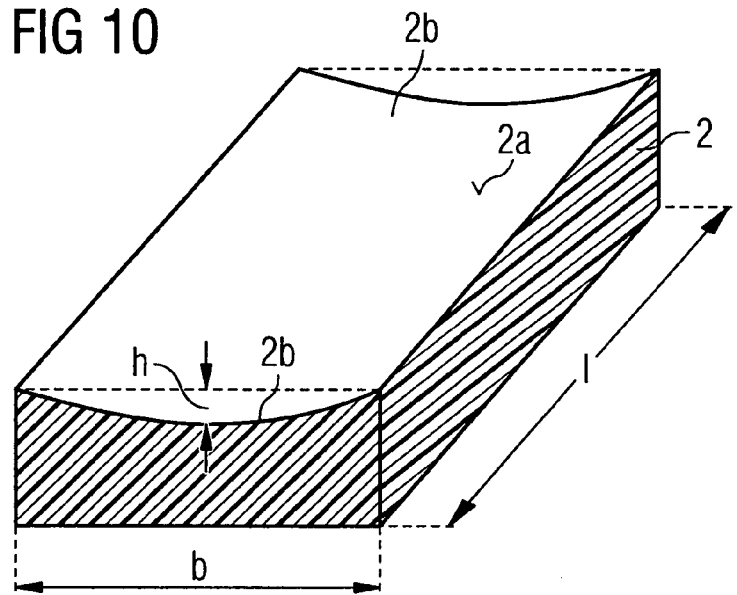

SEMICONDUCTOR CHIP ARRANGEMENT AND METHOD

CROSS-REFERENCE TO RELATED APPLICATIONS

This Utility Patent Application claims priority to German Patent Application No. DE 10 2004 021 633.9-33, filed on May 3, 2004, which is incorporated herein by reference.

FIELD OF THE INVENTION

The invention relates to a method for connecting a semiconductor chip to a chip carrier, and a semiconductor chip arrangement.

BACKGROUND

A chip carrier and a semiconductor chip are fixedly connected to one another by soldering or adhesive bonding, by way of example. For this purpose, in the case of soldering, the solder in the form of a wire is applied to the hot chip carrier and the chip is then deposited into the liquid solder. In the case of adhesive bonding, firstly the liquid adhesive is dispensed onto the chip carrier and then the chip is deposited into the liquid adhesive.

The connections produced by means of these methods have the disadvantage that cavities and thickenings can form in the connecting layers on account of the chip being deposited into a liquid connecting means. In the case of large-area connections, in particular, the connecting means are formed as comparatively thick layers in order to compensate for surface undulations of the materials to be connected.

The occurrence of such cavities and thick connecting layers have the disadvantage that the heat loss incurred in the semiconductor chip is dissipated only poorly via the chip carrier. The heat dissipation is worse the larger the area with which such cavities are formed and the thicker such connecting layers are formed.

This problem is all the more pronounced the larger the area with which the semiconductor chip is formed, since the probability of the occurrence of cavities or of thickened connecting layers rises as the chip area increases.

SUMMARY

Embodiments of the invention provide a semiconductor chip arrangement and method. In one embodiment, the invention provides a method for providing a semiconductor chip arrangement including providing a semiconductor chip having a first connecting area and providing a chip carrier having a concave shaped section formed in a second connecting area. A connecting mechanism is provided between the first connecting area and the second connecting area. The semiconductor chip is pressed onto the chip carrier such that the connecting mechanism positively locks the first connecting area to the concave shaped section of the second connecting area.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a semiconductor chip provided with a connecting means, which semiconductor chip is positioned in the region of the concavely shaped section of the chip carrier in accordance with FIG. 3, in cross section.

FIG. 5 illustrates a method in which the semiconductor chip positioned in accordance with FIG. 4 is pressed into the concavely shaped section of the chip carrier in a positively locking manner by means of a pressing-on tool.

FIG. 6 illustrates one embodiment of a semiconductor chip connected to the chip carrier in accordance with the method according to the invention.

FIG. 9 illustrates a further cross section through a chip carrier in accordance with FIG. 7.

FIG. 10 illustrates a chip carrier in accordance with FIG. 7, in which the concavely shaped section extends over the entire second connecting area, in a perspective illustration.

DETAILED DESCRIPTION

Figure 1:
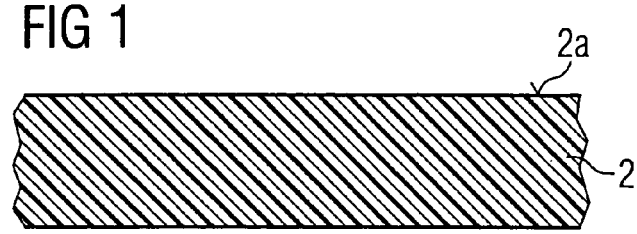
FIG. 1 illustrates one embodiment a detail from a chip carrier in cross section.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides a method by means of which even large-area semiconductor chips can be connected to a chip carrier without the occurrence of cavities when using thin connecting layers, and to provide a component arrangement having a semiconductor chip and a chip carrier connected to the semiconductor chip in which no cavities are present when using a thin connecting means.

In one embodiment, provision is made for providing a semiconductor chip having a first connecting area, for providing a chip carrier having a second connecting area, in which a concavely shaped section is formed, for applying a connecting means to the first and/or second connecting area, for positioning the semiconductor chip in such a way that the first connecting area and the concavely shaped section of the second connecting area face one another, and for pressing the semiconductor chip onto the chip carrier.

In one embodiment, the connecting means is applied to the first connecting area of the semiconductor chip before the semiconductor chip is connected to the chip carrier. The connecting means is in the form of solder or in the form of electrically conductive or electrically insulating adhesive. In the case of a solder, the chip carrier, before the semiconductor chip is pressed on, is heated to a temperature that is higher than the melting point of the solder applied to the first and/or second connecting area.

When the semiconductor chip is subsequently pressed onto the chip carrier, which is effected by means of a pressing-on tool, by way of example, the solder melts since it comes into thermal contact with the heated chip carrier. The solder is preferably a diffusion solder or a eutectic solder which combines with the metallic chip carrier in the molten state, in which case, a metallic compound having a higher melting point arises after the solidification of the solder, as a result of which the semiconductor chip and the chip carrier are fixedly connected. A precondition for this is that the chip carrier has not previously been heated above the melting point of the compound having a higher melting point.

If the connecting layer is in the form of an adhesive, then it is not necessary to heat the chip carrier before the semiconductor chip is pressed onto the chip carrier. The connection is preserved after the removal of the pressing-on tool by virtue of the effect of the adhesive.

In order to achieve a permanent connection between the semiconductor chip and the chip carrier, the arrangement comprising semiconductor chip, chip carrier and the connecting layer situated in between is heated to a temperature of preferably between 150° C. and 200° C. for a time of preferably 30 minutes to 60 minutes, so that the electrically conductive adhesive cures.

In one embodiment, the component arrangement according to the invention includes a semiconductor chip and a chip carrier with a connecting means arranged between the semiconductor chip and the chip carrier. In one embodiment, the semiconductor chip is arranged at a position of the chip carrier at which the latter has a concavely shaped section.

The provision of a chip carrier, which has a concavely shaped section in the region of a connecting area, forms a starting point for the method according to the invention. One exemplary embodiment of a procedure for producing such a chip carrier having a concavely shaped section is explained below with reference to FIGS. 1 to 3.

FIG. 1 illustrates a chip carrier 2, which has a connecting area 2a, at which the chip carrier 2 is intended to be connected to a semiconductor chip. The chip carrier 2 is preferably composed of metal.

Figure 2:
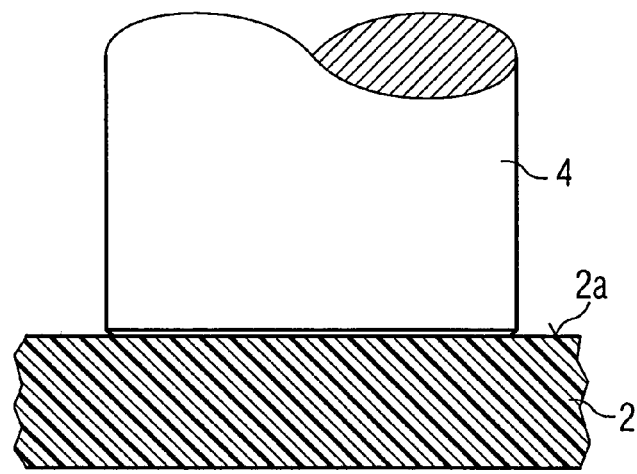
FIG. 2 illustrates the detail from the chip carrier in accordance with FIG. 1, during a planarization step.

FIG. 2 illustrates an optional planarization step, in which the connecting area 2a of the chip carrier 2 is planarized by means of a stamp 4 in order to reduce any possible undulation or roughness of the second connecting area 2a of the chip carrier 2. The remaining residual undulation of the second connecting area 2a after planarization is preferably less than 30 μm, and the remaining residual roughness is less than 2 μm. Instead of planarization by means of a stamp 4 or in addition to such planarization, it is also possible to planarize the chip carrier by means of a grinding and/or polishing step.

Figure 3:
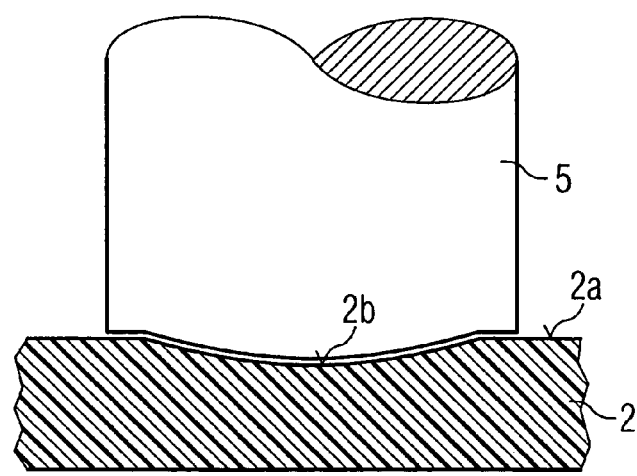
FIG. 3 illustrates a detail from a planarized chip carrier, during an embossing step for producing a concavely shaped section, in cross section.

Afterward, as illustrated in FIG. 3, the concavely shaped section 2b is produced on the second connecting area 2a of the chip carrier 2, for example by means of an embossing stamp 5. In this case, the embossing stamp 5 may be shaped such that a transition that runs as uniformly as possible arises between the concavely shaped section 2b and the adjoining region of the second connecting area 2a. The embossing stamp 5 is preferably configured such that the second connecting area 2a has an undulation and a roughness of less than 2 μm in the region of the concavely shaped section 2b. In particular, care must be taken to ensure that no burrs, no elevated edge acclivities and the like occur in the production of the concavely shaped section. Instead of an embossing stamp 5, the concavely shaped section 2b may also be produced for example by grinding, etching or other shaping methods.

FIG. 4 illustrates the result of a succeeding method process, in which a semiconductor chip 1, to whose first connecting area 1a a connecting mechanism or means 3 is applied, is positioned opposite the concavely shaped section 2b. In this case, the first connecting area 1a of the semiconductor chip 1 and the second connecting area 2b of the chip carrier 2 face one another. On account of the curvature of the concavely shaped section 2b, the semiconductor chip 1, whose first connecting area 1a is preferably formed in planar fashion, is at at least one edge and/or corner in the region of the concavely shaped section 2b of the connecting area 2a of the chip carrier 2.

In the succeeding operation, the semiconductor chip 1, as illustrated in FIG. 5, is pressed onto the chip carrier 2 by means of the front side 6a of a pressing-on tool 6 such that the semiconductor chip 1 flexes slightly and the first connecting area 1a, the connecting means 3 and the second connecting area 2a bear on one another in a positively locking manner. The front side 6a of the pressing-on tool 6 preferably generates a uniform pressure on the semiconductor chip 1. In this case, it is advantageous for the front side 6a to press onto the whole area of the semiconductor chip 1. Therefore, the front side 6a preferably projects above the semiconductor chip 1 in every lateral direction. The pressing-on tool 6 may be formed in rigid fashion in the region of its front side 6a and be composed for example of metal, ceramic, plastic or a combination of these materials. As an alternative to this, provision is made for forming the pressing-on tool 6 from a flexible material, for example a polymer, at its front side 6a. The use of a flexible material results in a particularly uniform pressure distribution when the semiconductor chip 1 is pressed onto the chip carrier 2.

During the pressing-on operation, the semiconductor chip 1 touches the second connecting area 2a in the region of the concavely shaped section 2b firstly in the region of at least one of its edges and/or corners. The semiconductor chip 1 is thereby fixed with respect to the chip carrier 2. Furthermore, a connection between the semiconductor chip 1 and the chip carrier 2 is formed by virtue of the effect of the connecting means 3 at the edges and/or corners.

If the connecting means 3 is a solder, for example, which melts upon contact with the chip carrier 2, which is heated for the purpose of melting the solder, and then immediately solidifies, a seal arises in this way in the region of said corners and/or edges, which seal prevents solder that is melted during the further embossing operation from flowing away in these directions.

Corresponding considerations also hold true for the use of an adhesive as connecting means 3.

Furthermore, on account of its surface tension, liquid solder flows into the narrow gap that forms between the semiconductor chip 1 and the chip carrier 2 when the semiconductor chip is pressed on, so that it is available for connecting the semiconductor chip 1 and the chip carrier 2.

On account of the concavely shaped section 2b, the connecting means 3 is thus prevented, to a certain degree, from laterally flowing out or being forced out from the intermediate region between the semiconductor chip 1 and the chip carrier 2 at least in specific directions. As a result, a larger part of the connecting means 3 is available for producing the connection between the semiconductor chip 1 and the chip carrier 2.

Owing to the simultaneously very low undulation or roughness of the concavely shaped section 2b of preferably in each case less than 2 µm, no or at least fewer or smaller air inclusions arise between the semiconductor chip 1 and the chip carrier 2. The connection between the semiconductor chip 1 and the chip carrier 2 is thus formed in closed fashion to the greatest possible extent and has a high mechanical strength and also a very low heat transfer resistance.

After the removal of the pressing-on tool 6, the semiconductor chip 1, the connecting means 3 and also the chip carrier 2 are connected to one another in a positively locking manner, as is shown in FIG. 6. If an adhesive is used as connecting means 3, it is preferably also cured in a succeeding heat treatment step. For this purpose, the arrangement comprising chip carrier 2, connecting means 3 and semiconductor chip 1 as shown in FIG. 6 is heated to a temperature of between 150° C. and 200° C. for a time period of typically 30 minutes to 60 minutes. The adhesive has cured after the heat treatment, so that a durable connection is present.

Figure 7:
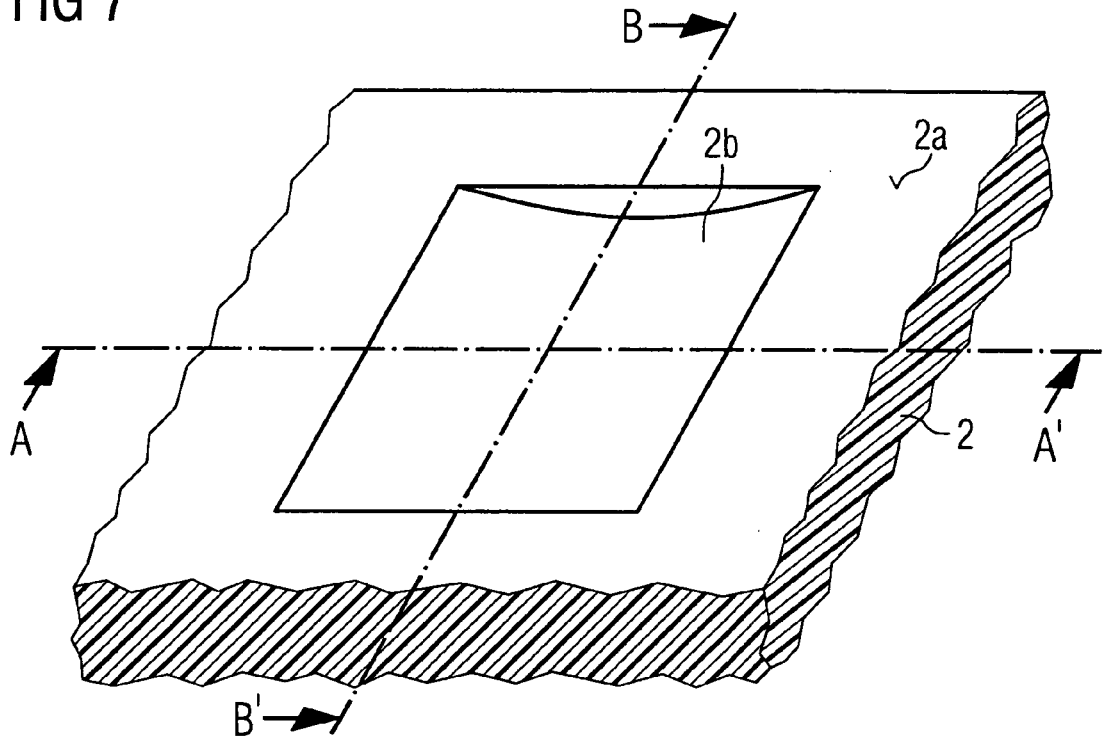
FIG. 7 illustrates a detail from a chip carrier having a concavely shaped section, in a perspective illustration.

FIG. 7 illustrates a detail from a chip carrier 2 provided with a concavely shaped section 2b, in perspective view. The concavely shaped section 2b has the form of a section of an outer surface of a cylinder. In principle, the concave section 2b of the second connecting area 2a may also have other forms, for example that of a section of a spherical shell.

Figure 8:
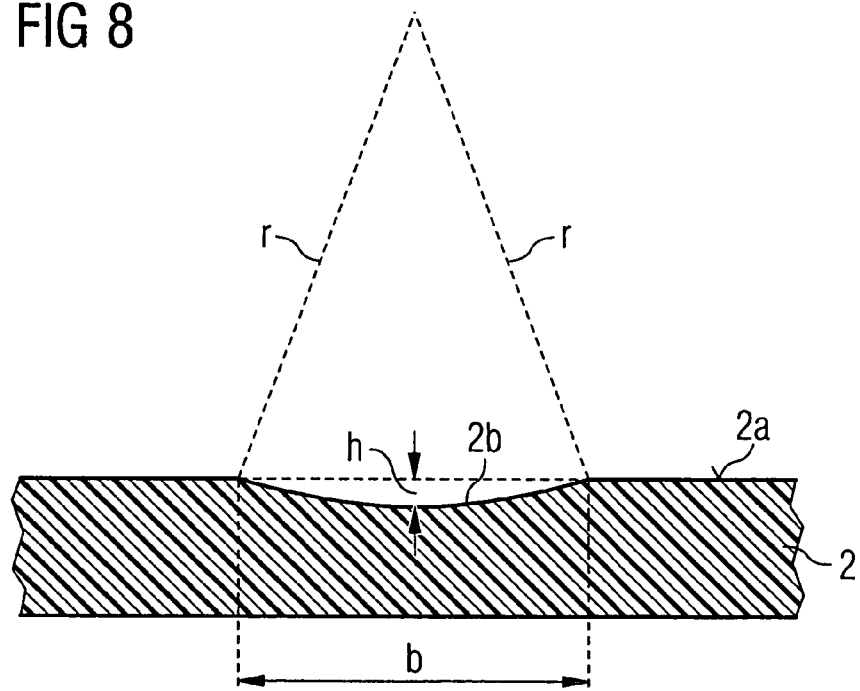
FIG. 8 illustrates a cross section through a chip carrier in accordance with FIG. 7.

FIG. 8 illustrates a cross section through the plane A-A' illustrated in FIG. 7. In this view, the concavely shaped section 2b has a radius r of curvature which corresponds to the radius of curvature of the outer surface of a cylinder and is preferably between 10 mm and 1000 mm. Furthermore, the concavely shaped section 2b has a width b, and also a maximum depth h, measured in relation to the regions of the second connecting area 2a which adjoin the concavely shaped section 2b. Preferred values for the width b are between 1 mm and 10 mm, and between 10 µm and 20 µm for the maximum depth h.

FIG. 9 illustrates a section through the plane B-B' shown in FIGS. 7 and 8 in the region of the maximum depth h. The concavely shaped section 2b has a length l. The concavely shaped section 2b is not curved in this view. Preferred values for the length l lie between 1 mm and 10 mm.

FIG. 10 illustrates a chip carrier 2 in accordance with FIG. 7, the concavely shaped section 2b extending over the entire second connecting area 2a. It is also optionally provided that the concavely shaped section 2b extends only over the entire width b, but not over the entire length l, or conversely only over the entire length l, but not over the entire width b of the chip carrier 2.

The method according to the invention makes it possible to connect one or correspondingly a plurality of semiconductor chips to a chip carrier. Various semiconductor chips may be arranged on the same or on different, for example mutually opposite, sides of the chip carrier.

The explanation of the method according to the invention with reference to the figures assumed that the connecting means was applied to the semiconductor chip prior to the connection of semiconductor chip 1 and chip carrier 2. It goes without saying that the connecting means can also be applied to the concave section 2b of the chip carrier 2 as an alternative to the application of the connecting means to the connecting area 1a of the semiconductor chip or in addition to the application of a connecting means to the connecting area 1a of the semiconductor chip.

The method operation of optional planarization and production of a concave section of the chip carrier as described with reference to FIGS. 2 and 3 may also be applied during the production of chip carriers.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A component arrangement comprising:
a semiconductor chip, having a first connecting area;
a chip carrier having a second connecting area; and
a connecting layer arranged between the first connecting area and the second connecting area, the second connecting area of the chip carrier having a concavely shaped section in the region of the semiconductor chip;
wherein the concavely shaped region is shaped concavely in relation to the semiconductor chip, wherein the semiconductor chip is, in a lateral direction, completely arranged in the concavely shaped region, and wherein the connecting layer is electrically conductive and extends continuously between two opposite sides of the semiconductor chip.

2. The component arrangement of claim 1, wherein the connecting layer comprises a solder of an electrically conductive or electrically conductive adhesive.

3. The component arrangement of claim 1, wherein the connecting layer comprises an electrically conductive adhesive.

4. The component arrangement of claim 1, comprising wherein the concavely shaped section has the form of a section of an outer surface of a cylinder or a section of a spherical shell.

5. The component arrangement of claim 1, comprising wherein the concavely shaped section extends over the entire second connecting area.

6. A component arrangement comprising:
a semiconductor chip, having a first connecting area and first and second sides;
a chip carrier having a second connecting area; and
a connecting layer arranged between the first connecting area and the second connecting area, the second connecting area of the chip carrier having a concavely shaped section in the region of the semiconductor chip;
wherein the concavely shaped region is shaped concavely in relation to the semiconductor chip, wherein the semiconductor chip is, in a lateral direction, arranged in the concavely shaped region, the semiconductor chip having a convex curved surface in the concavely shaped region, corresponding to a curve of the concavely shaped region, and wherein the connecting layer is electrically conductive and extends continuously between the first and second sides of the semiconductor chip.

7. The component arrangement of claim 1, wherein the second connecting area of the chip carrier has an undulation or roughness less than 2 µm in the region of the concavely shaped section.

8. The component arrangement of claim 1, wherein the connection layer provides a seal within the concavely shaped region.

9. The component arrangement of claim 4, wherein the concavely shaped section of the chip carrier has a radius of curvature which corresponds to the radius of curvature of the outer surface of a cylinder.

10. The component arrangement of claim 1, wherein the concavely shaped section extends over at least the entire width or length of the second connecting area.

11. The component arrangement of claim 1, wherein the semiconductor chip is comprised of a flexible material.

12. The component arrangement of claim 1, comprising wherein the semiconductor chip includes a flexed, convex curved surface press-fit into the concavely shaped region.

* * * * *

UNITED STATES PATENT AND TRADEMARK OFFICE
CERTIFICATE OF CORRECTION

| | |
|---|---|
| PATENT NO. | : 7,511,382 B2 |
| APPLICATION NO. | : 11/120838 |
| DATED | : March 31, 2009 |
| INVENTOR(S) | : Riedl et al. |

It is certified that error appears in the above-identified patent and that said Letters Patent is hereby corrected as shown below:

On the Title Page, Item (30), Foreign Application Priority Data, delete "10 2004 021 633" and insert in place thereof --10 2004 021 633. 9--.

Column 6, line 31-32, delete "or electrically insulating".

Signed and Sealed this

Sixth Day of October, 2009

David J. Kappos
*Director of the United States Patent and Trademark Office*